(12) United States Patent
Yang et al.

(10) Patent No.: US 7,772,891 B1
(45) Date of Patent: Aug. 10, 2010

(54) SELF-TIMED DYNAMIC SENSE AMPLIFIER FLOP CIRCUIT APPARATUS AND METHOD

(75) Inventors: Ge Yang, Pleasanton, CA (US); Guoqing Ning, Santa Clara, CA (US); Beibei Ren, Milpitas, CA (US); Hwong-Kwo (Hank) Lin, Palo Alto, CA (US); Charles Chew-Yuen Young, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 43 days.

(21) Appl. No.: 11/957,242

(22) Filed: Dec. 14, 2007

(51) Int. Cl.
*H03K 19/096* (2006.01)

(52) U.S. Cl. ............. 326/95; 326/98; 327/211; 327/218

(58) Field of Classification Search ............ 326/93–98, 326/105, 112, 119, 121; 327/199–205, 114–118, 327/333, 208–212, 172–173, 250–259, 291, 327/295, 56–57; 365/191, 194, 196, 207, 365/202, 208, 210, 154
See application file for complete search history.

(56) References Cited

U.S. PATENT DOCUMENTS

| 5,783,949 | A  | * | 7/1998  | Reohr et al. ............. 326/106 |
|-----------|----|---|---------|-----------------------------------|
| 6,265,923 | B1 | * | 7/2001  | Amir et al. .............. 327/218 |
| 6,424,195 | B2 | * | 7/2002  | Samala ................... 327/211 |
| 6,496,038 | B1 | * | 12/2002 | Sprague et al. ............ 326/95 |
| 6,693,459 | B2 | * | 2/2004  | Nedovic et al. ............ 326/93 |
| 7,164,302 | B1 | * | 1/2007  | Elkin .................... 327/208 |
| 7,205,810 | B1 | * | 4/2007  | Lee et al. ............... 327/231 |
| 7,417,468 | B2 | * | 8/2008  | Verbauwhede et al. ...... 326/112 |

* cited by examiner

*Primary Examiner*—James H. Cho
*Assistant Examiner*—Christopher Lo
(74) *Attorney, Agent, or Firm*—Berkeley Law & Technology Group, LLP

(57) ABSTRACT

Apparatuses and methods are provided for a self-timed dynamic sense amplifier flop circuit, wherein a pulse generating circuit may be adapted to generate at least a first logic signal based, at least in part, on a first evaluation node signal, and a discharge path circuit comprising at least a first transistor within a first stack of transistors may be operatively responsive to the first timing signal.

19 Claims, 5 Drawing Sheets

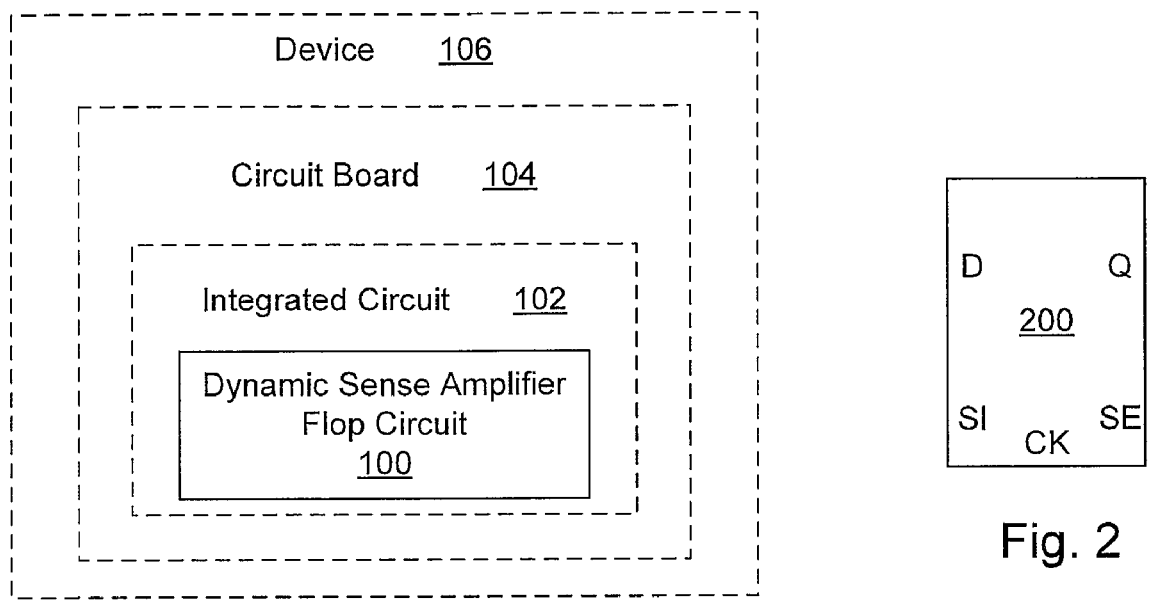
Fig. 1
Fig. 2
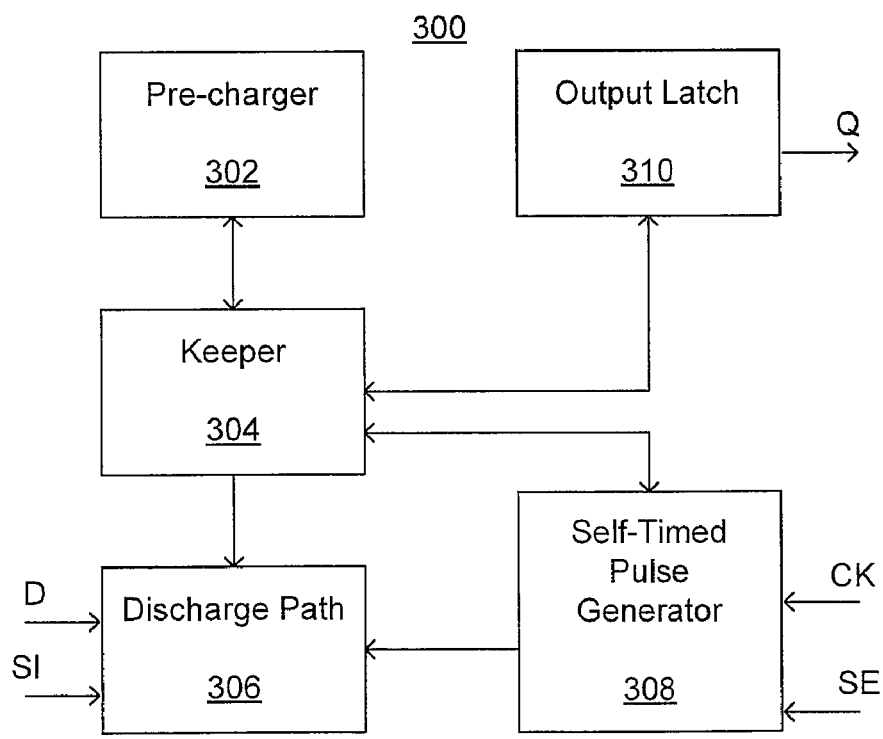
Fig. 3

US 7,772,891 B1

SELF-TIMED DYNAMIC SENSE AMPLIFIER FLOP CIRCUIT APPARATUS AND METHOD

BACKGROUND

1. Field

The subject matter disclosed herein relates to electronic circuitry, and more particularly to apparatuses and methods associated with a self-timed dynamic sense amplifier flop circuit.

2. Information

Digital circuits are often provided to evaluate a signal and momentarily maintain or otherwise reproduce the signal for other circuits to access. The evaluated signal may be provided for only a short period of time and thus the evaluating circuit may need to operate quickly to determine the signal. The signal may, for example, represent a logic value or state, such as a logic "0" or "1".

Such evaluating circuits may be included in an integrated circuit. Such circuits may be referred to as flop circuits. As integrated circuits become smaller, for example as a result of new manufacturing processes, new flop circuit designs may be required.

BRIEF DESCRIPTION OF DRAWINGS

Non-limiting and non-exhaustive aspects are described with reference to the following figures, wherein like reference numerals refer to like parts throughout the various figures unless otherwise specified.

FIG. 1 is a block diagram illustrating an exemplary embodiment of an apparatus having at least one dynamic sense amplifier flop circuit.

FIG. 2 is a block diagram illustrating an exemplary embodiment of a dynamic sense amplifier flop circuit, for example, as in FIG. 1.

FIG. 3 is a block diagram illustrating an exemplary embodiment of a dynamic sense amplifier flop circuit, for example, as in FIGS. 1 and/or 2.

DETAILED DESCRIPTION

Figure 4:
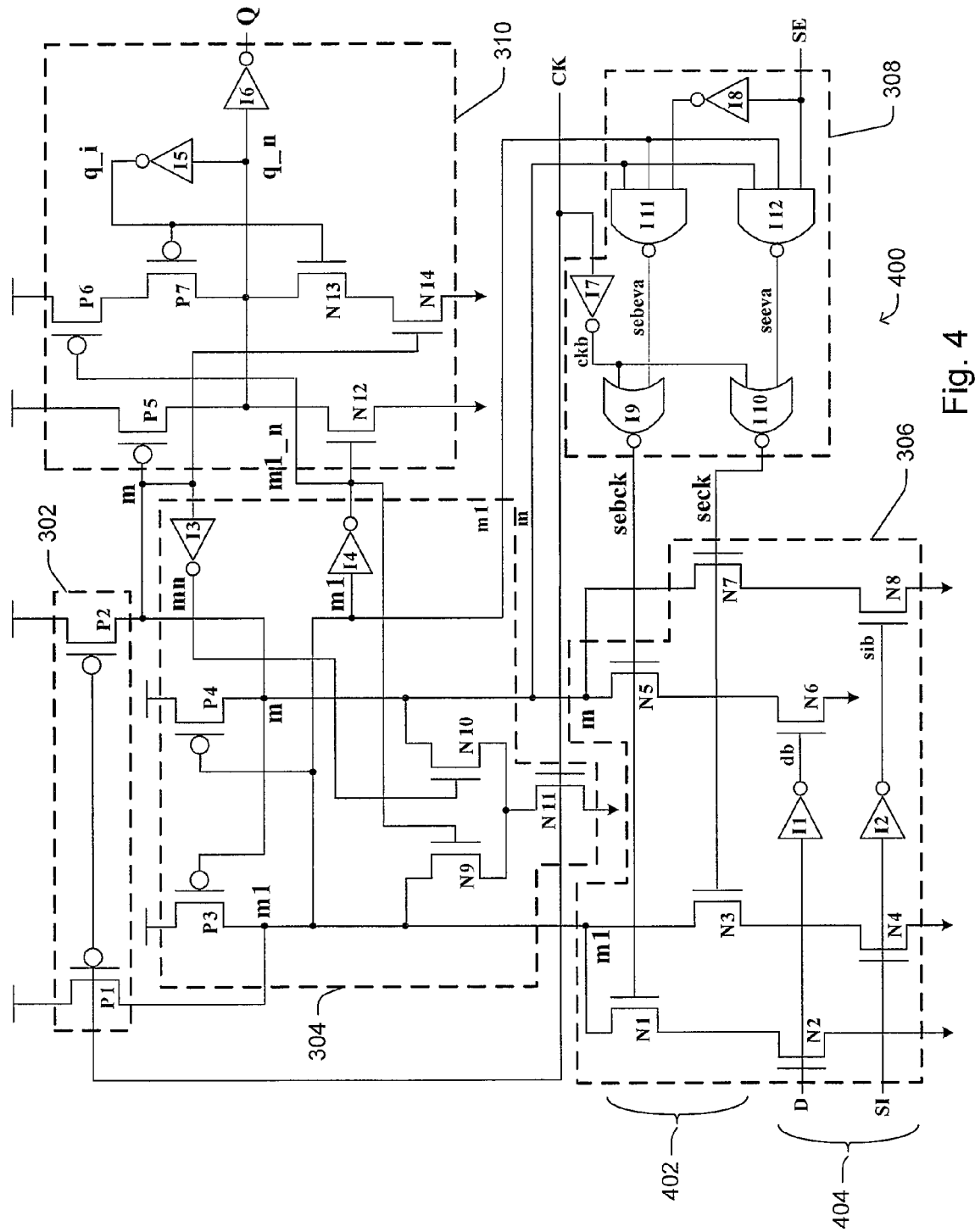
FIG. 4 is a schematic diagram illustrating an exemplary embodiment of a self-timed dynamic sense amplifier flop circuit, for example, as in FIGS. 1, 2 and/or 3.

Some exemplary methods and apparatuses are described and shown herein that may be used in signal/data evaluating circuits. In accordance with certain exemplary embodiments, self-timed dynamic sense amplifier flop circuits and related methods and techniques are presented which may, for example, provide for improved performance and/or tolerance to certain manufacturing process variations associated with integrated circuits.

FIG. 1 is a block diagram illustrating an exemplary dynamic sense amplifier flop circuit 100. As shown, circuit 100 may be provided as part of an integrated circuit 102. Integrated circuit 102 is representative of any type of integrated circuit or other like circuitry and may include additional circuitry (not shown) that may be coupled to dynamic sense amplifier flop circuit 100. Integrated circuit 102 may, for example, include a logic circuit wherein a data signal may be sensed/scanned at a specific time and the sensed/scanned logical state of the data signal may be maintained for a selected period of time by dynamic sense amplifier flop circuit 100. By way of example but not limitation, integrated circuit 102 may include a processing unit such as a central processing unit (CPU), a graphical processing unit (GPU), a coprocessor, a digital signal processor (DSP), an application-specific integrated circuit (ASIC), programmable gate array, an integrated circuit with memory circuits, an integrated circuit with analog electrical circuits, and/or the like.

Integrated circuit 102 may, for example, be provided on or otherwise operatively coupled to a circuit board 104. Circuit board 104 is representative of any type of printed circuit board or other like arrangement for operatively coupling integrated circuits or the like. By way of example but not limitation, circuit board 104 may include a graphics card, a motherboard, and/or the like.

As further illustrated in FIG. 1, Circuit board 104 may be provided for use in a device 106. Device 106 is representative of any device that may include electronic circuitry. By way of example but not limitation, device 106 may include a computing device, a communication device, a machine, an appliance, a vehicle, and/or the like.

FIG. 2 illustrates a dynamic sense amplifier flop circuit 200, which may be the same or similar to dynamic sense amplifier flop circuit 100, in an exemplary block form as having as inputs D, CK, SE, and SI, and providing a Q output. The Q output is related to D input in that the Q output may represent a sensed logic state of the D input. The D input, wherein the "D" stands for "data", may be coupled to another circuit (not shown) that is capable of outputting or otherwise having a data signal that may be associated with a logic state. The CK input, wherein "CK" stands for "clock", may be coupled to a timing circuit (not shown) that is capable of outputting a timing signal suitable for use by at least dynamic sense amplifier flop circuit 200. The SE input, wherein the "SE" stands for "scan enable", may be coupled to at least one other circuit (not shown) that is capable of outputting a scan enable signal suitable for use by at least dynamic sense amplifier flop circuit 200. The SI input, wherein the "SI" stands for "scan in", may be coupled to one or more other circuits (not shown) capable of outputting a scan in signal suitable for use by at least dynamic sense amplifier flop circuit 200.

FIG. 3 is a block diagram illustrating exemplary functional circuitry that may be provided within a dynamic sense amplifier flop circuit 300, which may be the same or similar to dynamic sense amplifier flop circuits 100 and/or 200.

Here, for example, a pre-charger 302 may be adapted to pre-charge or otherwise operatively prepare at least a portion of the flop circuit during a pre-charge phase prior to sensing/scanning the D input. Such pre-charge phase may, for example, be initiated based on a timing signal and/or other signals, such as may be provided via the CK input. As illustrated, pre-charger 302 may be coupled to a keeper 304.

For simplification purposes, the CK input is illustrated as being provided to a self-timed pulse generator 308, however, it should be understood that the CK input and/or corresponding signals may be provided to one or more of the other functional circuits within dynamic sense amplifier flop circuit 300. Similarly, other signals may be shared between the circuits in dynamic sense amplifier flop circuit 300.

Keeper 304 may be adapted to maintain a sensed/scanned logic value resulting from an evaluation phase that occurs subsequent to the pre-charge phase. For example, keeper 304 may be adapted to maintain the sensed/scanned logic value of the D input even if the D input changes at some later time. As illustrated in this example, keeper 304 may be coupled to a discharge path 306, a self-timed pulse generator 308, and/or an output latch 310.

Discharge path 306 may be adapted to selectively discharge and/or otherwise affect keeper 304 during the evaluation phase based, at least in part, on the D input. For example, discharge path 306 may discharge a selected evaluation node of keeper 304 based on the logic state of the D input. Discharge path 306 may be adapted to selectively discharge and/or otherwise affect keeper 304 during the evaluation phase based, at least in part, on the SI input. For example, discharge path 306 may discharge a selected evaluation node of keeper 304 when signaled to do so based, at least in part, on the SI input. Discharge path 306 may be adapted to selectively discharge and/or otherwise affect keeper 304 during the evaluation phase based, at least in part, on one or more logic signals from self-timed pulse generator 308. For example, discharge path 306 may discharge a selected evaluation node within at least keeper 304 when signaled to do so based, at least in part, on at least on logic signal from self-timed pulse generator 308. Accordingly, as illustrated discharge path 306 may be coupled to self-timed pulse generator 308.

Self-timed pulse generator 308 may be adapted to generate at least one self-timed logic signal that may be provided to discharge path 306. The self-timed logic signal may, for example, take the form of a "pulse" that may be generated by self-timed pulse generator 308 based, at least in part, on at least one logic signal maintained by keeper 304. The self-timed logic signal may, for example, be generated by self-timed pulse generator 308 based, at least in part, on the SE input. The self-timed logic signal may, for example, be generated by self-timed pulse generator 308 based, at least in part, on the CK input.

Output latch 310 may be adapted to maintain a logic state indicative of the sensed/scanned logic value within keeper 304 resulting from the evaluation phase and provide the Q output which matches the sensed/scanned logic value of the D or SI input. For example, output latch 310 may be adapted to maintain the logic state while the keeper 304 may be changing (e.g., reset) during a subsequent pre-charge phase.

Attention is now drawn to FIG. 4, which is a schematic diagram illustrating an exemplary dynamic sense amplifier flop circuit 400, which may be the same or similar to dynamic sense amplifier flop circuits 100, 200, and/or 300. For example, dashed lined regions are shown to indicate some exemplary circuitry that may be included within pre-charger 302, keeper 304, discharge path 306, self-timed pulse generator 308, and output latch 310.

The terms logic signal and node are used interchangeably herein. Transistors that are PMOS transistors in this example are identified by the letter "P" followed by a number. Transistors that are NMOS transistors in this example are identified by the letter "N" followed by a number. Logic circuits/gates in this example are identified by the letter "I" followed by a number.

Those skilled in the art will recognize that one or more different or additional components may be included or otherwise substituted into the design. For example, the logic performed within the circuit may be provided by a different set of logic gates, circuits, etc.

As shown in this example, pre-charger 302 may include transistors P1 and P2. Transistor P1 may have a gate coupled to the CK input, a source coupled to the V source (e.g., $V_{DD}$) and a drain coupled to an evaluation node m1. Transistor P2 may have a gate coupled to the CK input, a source coupled to the V source and a drain coupled to an evaluation node m.

Here, for example, the evaluation nodes m and m1 are also provided within keeper 304 and discharge path 306. As part of a pre-charge phase the evaluation node signals at evaluation nodes m and m1 may be brought up to a logic "1" state by pre-charger 302 since as part of a previous evaluation phase one of these two evaluation node signals will have been discharged based, at least in part, on the logic value of the D or SI input.

Keeper 304 may include inverters I3 and I4, and transistors P3, P4, N9, N10, and N11. Inverter I3 may have an input coupled to evaluation node m and an output coupled to a gate of transistor N10. The output of inverter I3 is shown as logic signal mn. Inverter I4 may have an input coupled to evaluation node m1 and an output coupled to gates of transistor N9 (and transistors P6 and N12 of output latch 310). The output of inverter I4 is shown as logic signal m1_n. Transistor P3 may have a gate coupled to evaluation node m, a source coupled to the V source and a drain coupled to evaluation node m1. Transistor P4 may have a gate coupled to evaluation node m1, a source coupled to the V source and a drain coupled to evaluation node m. Transistor N9 may have a gate coupled to node m1_n, a source coupled to the evaluation node m1 and a drain coupled to a source of transistor N11. Transistor N10 may have a gate coupled to node mn, a source coupled to evaluation node m and a drain coupled to a source of transistor N11. Transistor N11 may have a gate coupled to the CK input, a source coupled to the drains of transistors N9 and N10 and a drain coupled to V return (e.g., $V_{SS}$, ground).

Here, for example, transistor P3 may be operated to maintain an evaluation node signal of logic "1" at evaluation node m1, or transistors N9 and N11 may be operated to maintain an evaluation node signal of logic "0" at evaluation node m1. Similarly, for example, transistor P4 may be operated to maintain an evaluation node signal of logic "1" at evaluation node m, or transistors N10 and N11 may be operated to maintain an evaluation signal of logic "0" at evaluation node m.

Discharge path 306 may include invertors I1 and I2 and transistors N1, N2, N3, N4, N5, N6, N7, and N8. Inverter I1 may have an input coupled to the D input and an output coupled to a gate of transistor N6. The output of inverter I1 is shown as logic signal db. Inverter I2 may have an input coupled to the SI input and an output coupled to a gate of transistor N8. The output of inverter I2 is shown as logic signal sib. Transistor N1 may have a gate coupled to logic signal sebck from pulse generator 308, a source coupled to the evaluation node m1 and a drain coupled to a source of transistor N2. Transistor N2 may have a gate coupled to the D input, a source coupled to the drain of transistor N1 and a drain coupled to V return. Transistor N3 may have a gate coupled to logic signal seck, a source coupled to the evaluation node m1 and a drain coupled to a source of transistor N4. Transistor N4 may have a gate coupled to the SI input, a source coupled to the drain of transistor N3 and a drain coupled to V return. Transistor N5 may have a gate coupled to logic signal sebck from pulse generator 308, a source coupled to evaluation node m and a drain coupled to a source of transistor N6. Transistor N6 may have a gate coupled to logic signal db from inverter I1, a source coupled to the drain of transistor N5 and a drain coupled to V return. Transistor N7 may have a gate coupled to logic signal seck from pulse generator 308, a source coupled to evaluation node m and a drain coupled to the source of transistor N8. Transistor N8 may have a gate coupled to logic signal sib from inverter I2, a source coupled to the drain of transistor N7 and a drain coupled to V return.

In this example, discharge path 306 includes two stacks of transistors. Here, for example, transistors N1, N3, N5, and N7 represent one stack of transistors 402, and transistors N2, N4, N6, and N8 represent one stack of transistors 404. In this exemplary arrangement, the transistors in the upper stack of transistors are each operatively responsive to a certain logic signal from self-timed pulse generator 308. More specifically, transistors N1 and N5 are operatively responsive to the sebck logic signal and transistors N3 and N7 are operatively responsive to the seck logic signal. As described in greater detail below, the logic signals sebck and seck are each based on a combination of the evaluation node signals at evaluation nodes m and m1, the SE input and the CK input.

In this exemplary arrangement, the lower stack of transistors N2 and N6 are operatively responsive to the D signal and corresponding db signal, respectively, and transistors N4 and N8 are operatively responsive to the SI input and corresponding sib signal. With such a two stack arrangement, an applicable evaluation node signal (from either node m or m1) may be selectively discharged in a manner such that substantially all of the electrical current associated with the discharge flows through one transistor in the upper stack and one transistor in the lower stack. As will be described in greater detail, such a short discharge path may provide substantial performance benefits when compared to longer and/or possibly slower discharge paths, such as, for example, a four transistor stack circuit.

Self-timed pulse generator 308 may include logic, such as, for example, provided by inverters I7 and I8, NAND gates I11 and I12, and NOR gates I9 and I10. Inverter I7 may have an input coupled to the CK input and an output coupled to an input of NOR gate I9. The output of inverter I7 is shown as logic signal ckb. Inverter I8 may have an input coupled to the SE input and an output coupled to an input of NAND gate I11. NAND gate I11 may have an input coupled to evaluation node m, an input coupled to node evaluation m1 and an input coupled to the output of inverter I8, and an output coupled to an input of NOR gate I9. The output of NAND gate I11 is shown as logic signal sebeva. NAND gate I12 may have an input coupled to evaluation node m, an input coupled to evaluation node m1 and an input coupled to the SE input, and an output coupled to an input of NOR gate I10. The output of NAND gate I12 is shown as logic signal seeva. NOR gate I9 may have an input coupled to the output of inverter I7 and an input coupled to the output of NAND gate I11, and an output coupled to the gates of transistors N1 and N5 of discharger 306. The output of NOR gate I9 is shown as logic signal sebck. NOR gate I10 may have an input coupled to the output of inverter I7 and an input coupled to the output of NAND gate I12, and an output coupled to the gates of transistors N3 and N7 of discharger 306. The output of NOR gate I10 is shown as logic signal seck.

Thus, in this example, self-timed pulse generator 308 may generate logic signals sebck and seck based on a combination of an evaluation node signal from node m, an evaluation node signal from node m1, the CK input signal, and the SE input signal. For example, sebck may be at a logic "1" state when evaluation node signal from node m is at logic "1", the evaluation node signal from node m1 is at logic "1", the CK input signal is at logic "1", and the SE input signal is at logic "0". For example, seck may be at a logic "1" state when evaluation node signal from node m is at logic "1", the evaluation node signal from node m1 is at logic "1", the CK input signal is at logic "1", and the SE input signal is at logic "1".

Self-timed pulse generator 308 may, for example, be adapted to initiate logic state transitions of logic signals sebck and/or seck based on certain edges (e.g., rising or falling edge transitions) of one or more of the evaluation node signals from nodes m and/or m1, and/or the CK input signal. For example, logic signals sebck or seck may be transitioned to a logic "1" based on a rising CK input signal. For example, logic signals sebck and/or seck may be transitioned to a logic "0" based on a falling evaluation node signal from nodes m or m1. In this example, the logic equation for sebck is: sebck=!SE*CK*m*m1. In this example, the logic equation for seck is: seck=SE*CK*m*m1.

Output latch 310 may include inverters I5, and I6, and transistors P5, P6, P7, N12, N13, and N14. Inverter I5 may have an input coupled to output latch node q_n and an output coupled to gates of transistors P7 and N13. The output of inverter I5 is shown as logic signal q_i. Inverter I6 may have an input coupled to output latch node q_n and an output coupled to the Q output. The output of inverter I6 is shown as logic signal Q. Transistor P5 may have a gate coupled to evaluation node m, a source coupled to V source and a drain coupled to output latch node q_n. Transistor P6 may have a gate coupled to node m1_n, a source coupled to V source and a drain coupled to a source of transistor P7. Transistor P7 may have a gate coupled to node q_i, a source coupled to the drain of transistor P6 and a drain coupled to output latch node q_n. Transistor N12 may have a gate coupled to the output of inverter I4, a source coupled to output latch node q_n and a drain coupled to V return. Transistor N13 may have a gate coupled to node q_i, a source coupled to output latch node q_n and a drain coupled to a source of transistor N14. Transistor N14 may have a gate coupled to evaluation node m, a source coupled to the drain of transistor N13 and a drain coupled to V return.

Here, for example, if discharge path 306 discharges the evaluation node signal from node m1 in response to the D input being at a logic "1" when evaluated, then transistor N12 will be ON and latch node q_n will be at logic "0" and the Q output will be logic "1". Similarly, if discharge path 306 discharges the evaluation node signal from node m in response to the D input being at a logic "0" when evaluated, then transistor P5 will be ON and latch node q_n will be at logic "1" and the Q output will be logic "0". Output latch 310 may be adapted, for example as shown, to maintain latch node q_n in such applicable logic state following an evaluation phase and during at least a subsequent pre-charge phase.

Figure 5:
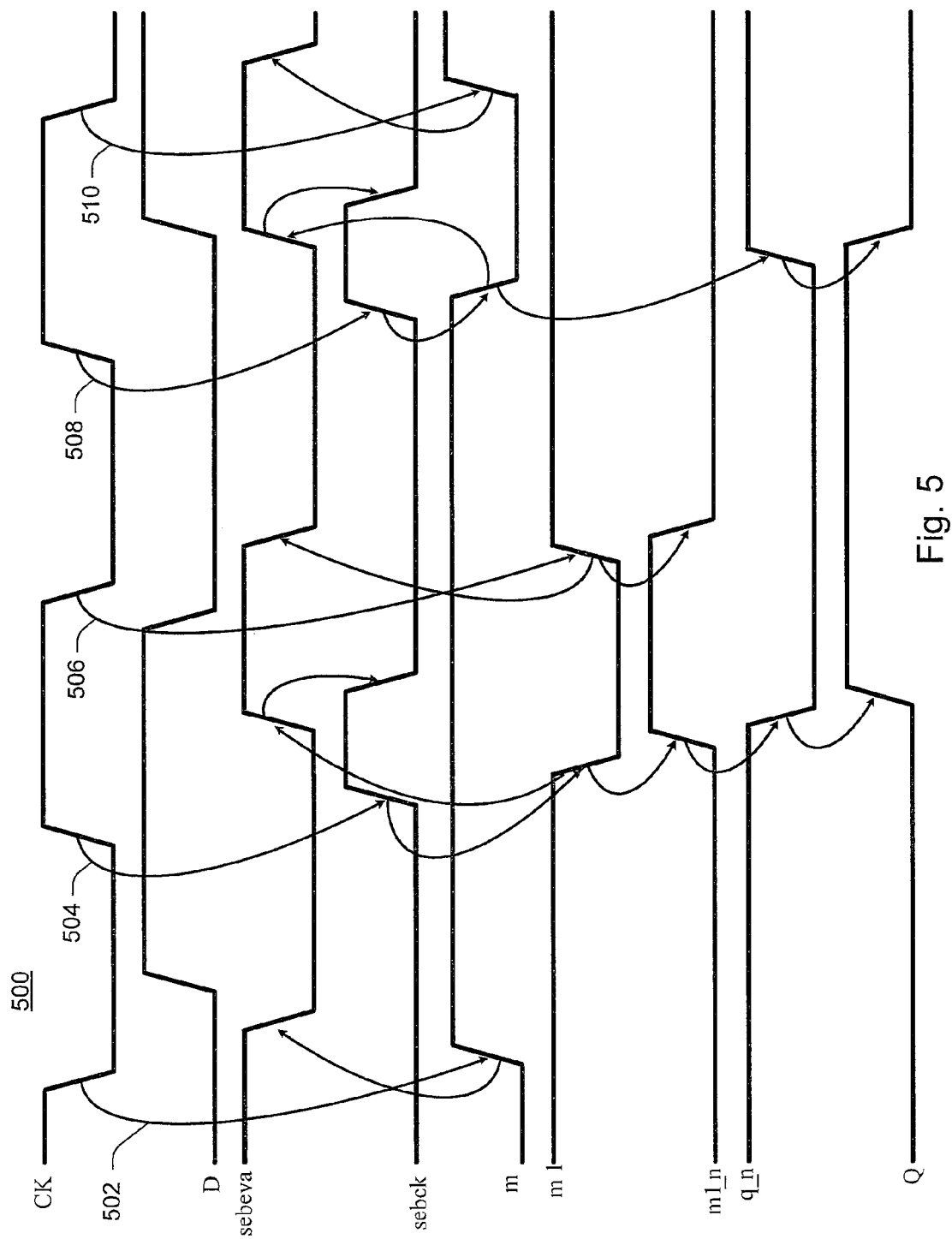
FIG. 5 is a timeline diagram illustrating certain waveforms associated with signals of the exemplary self-timed dynamic sense amplifier flop circuit of FIG. 4.

Attention is now drawn to FIG. 5, which is a timing diagram 500 illustrating certain transitioning waveforms associated with the exemplary dynamic sense amplifier flop circuit 400.

Starting at the top of FIG. 5, the exemplary waveforms, which are illustrated over time, include a CK input, a D input, a sebeva logic signal, a sebck logic signal, an evaluation node signal at node m, an evaluation node signal at node m1, a m1_n logic signal, a signal at latch node q_n, and a Q output signal.

In FIG. 5, certain transitional relationships associated with the waveforms are further identified by sets of referencing arrows 502, 504, 506, 508 and 510. The terms "rise" and "fall" are used herein to describe a transition in a waveform from one logic state to another logic state. For example, a waveform may rise to transition from a logic "0" state to a logic "1" state and may fall to transition from a logic "1" state to a logic "0" state. Timing diagram 500 and the various waveforms therein are for illustrative purposes only and as such have not been drawn to scale and/or otherwise indicative of actual collected signal data.

Referencing arrows 502 indicate that a fall of the CK input signal may lead to a rise of the evaluation signal at node m, and a fall of the sebeva logic signal. For example, this may occur during a pre-charge phase wherein node m is returned to a logic "1" state.

Referencing arrows 504 may be associated with an evaluation phase. Here, for example, a rise of the CK input signal may lead to a rise of the sebck logic signal. Since the D input signal is at logic "1", the evaluation signal at node m1 falls due to discharge path 306. The transition of the evaluation signal at node m1 may lead to a change of the sebeva logic signal, which in turn leads to a fall in the sebck logic signal. Thus, in this manner, for example, the sebck logic signal has a "pulse" shape. This exemplary "pulse" shape of the logic signals generated by self-timed pulse generator 308 may provide additional benefit in certain implementations in that such pulsed logic signals may inherently track or otherwise provide correction for certain manufacturing and/or resulting operational variations.

As further illustrated by referencing arrows 504, a fall of the evaluation signal at node m1 may lead to a rise of the m1_n node signal, which may lead to a fall of the signal at latch node q_n and hence a rise of the Q output signal to a logic "1", for example, in accord with the evaluated D input signal.

Referencing arrows 506 indicate a subsequent pre-charge phase, similar to that associated with referencing arrows 502, except that this time evaluation node m1 is brought back to logic "1". The Q output signal is not affected and remains at logic "1" despite the pre-charge phase and also a change in the D input signal.

Referencing arrows 508 illustrate another evaluation phase, similar to that associated with referencing arrows 504, however in this example the D input signal is at logic "0" when evaluated and hence there is a discharge of the evaluation signal at node m and the resulting Q output signal is at a logic "0".

Finally, referencing arrows 510 indicate yet another pre-charge phase, which is similar to that associated with referencing arrows 502. The Q output signal is not affected and remains at logic "0" despite the pre-charge phase and also a change in the D input signal.

Figure 6:
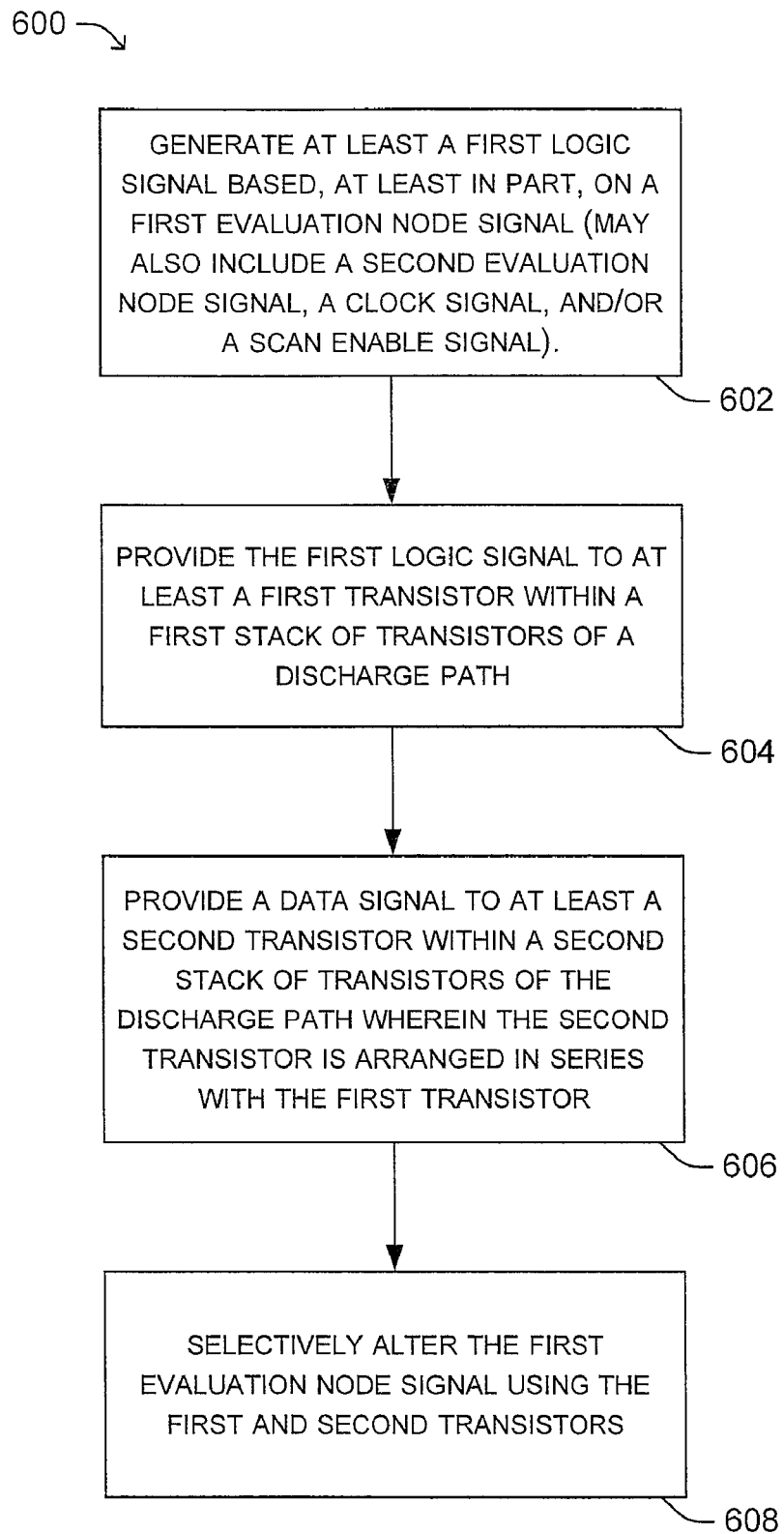
FIG. 6 is a flow diagram illustrating an exemplary method for use in a circuit, such as, for example, in FIGS. 1, 2, 3, and/or 4.

Attention is now drawn to FIG. 6, which is a flow diagram illustrating a method 600 that may be used, for example, in a circuit such as an integrated circuit or the like. At block 602, at least a first logic signal (e.g., sebck, seck) may be generated based, at least in part, on a first evaluation node signal (e.g., at node m or m1). Here, for example, the evaluation node signal may be associated with a keeper circuit or the like. The first logic signal may also be based, at least in part, on a second evaluation node signal, a clock signal, and/or a scan enable signal. At block 604, the first logic signal may be provided to at least a first transistor (e.g., transistor N1) within a first stack of transistors of a discharge path wherein the first transistor is operatively responsive to the first logic signal. At block 606, a data signal (e.g., a D input signal) may be provided to at least a second transistor (e.g., transistor N2) within a second stack of transistors of the discharge path. Here, the second transistor may be arranged in series with the first transistor and operatively responsive to the data signal. At block 608, the first evaluation node signal may be selectively altered (e.g., discharged) using the first transistor and the second transistor.

Figure 7:
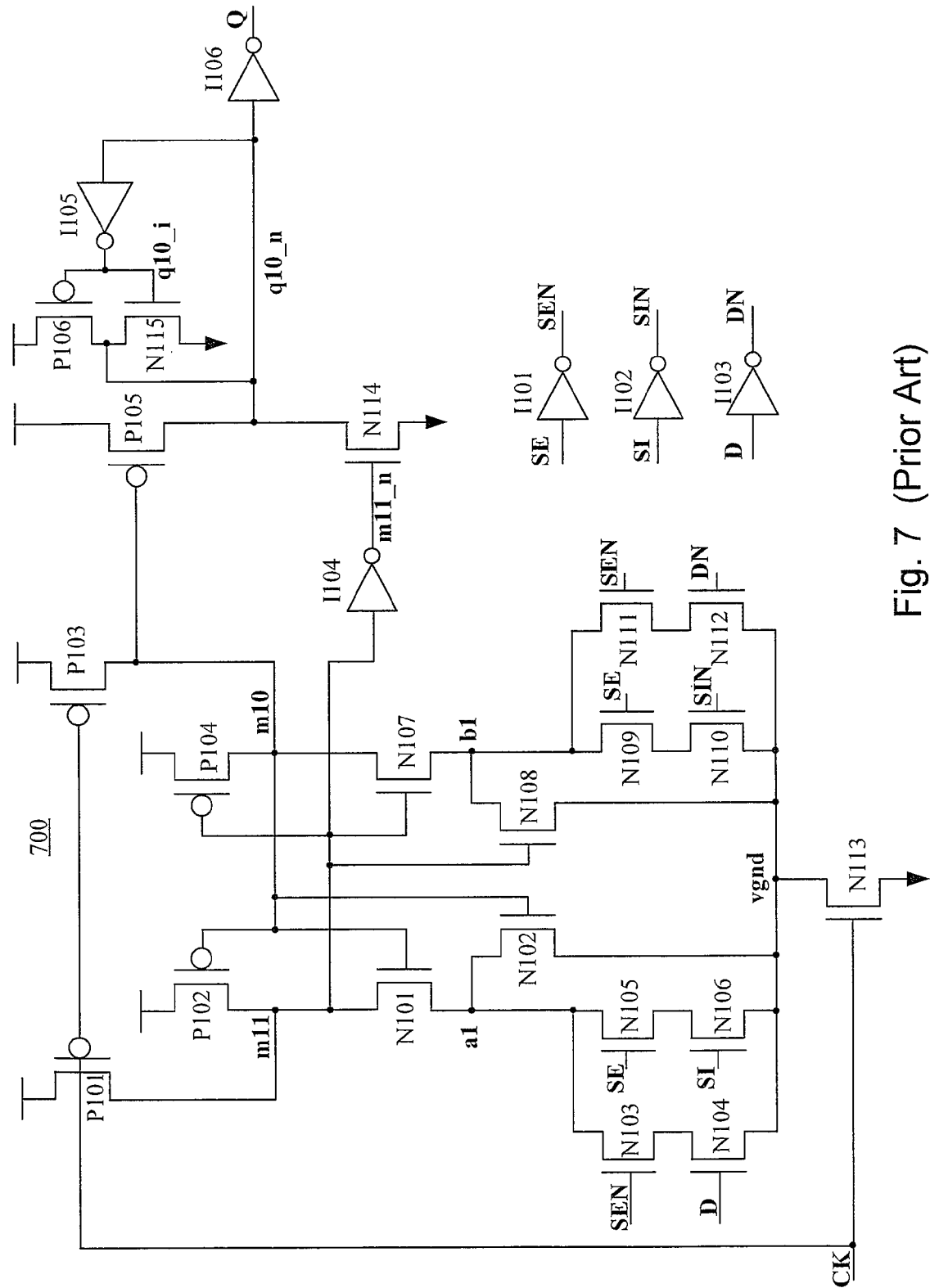
FIG. 7 is a schematic diagram illustrating a contemporary sense amplifier flop circuit.

FIG. 7 is a schematic diagram illustrating a contemporary sense amplifier flop circuit 700 that may be found in certain currently available integrated circuits, such as those manufactured using a 90 nm process. Unfortunately, in certain situations sense amplifier flop circuit 700 may not scale well to manufacturing processes less than 90 nm due to process variations which may lead to failure or other operational limitations of sense amplifier flop circuit 700.

Unlike the two transistor stack discharge path presented in exemplary dynamic sense amplifier flop circuit 400, sense amplifier flop circuit 700 employs a four transistor stack discharge path which may not perform as fast. Unlike exemplary dynamic sense amplifier flop circuit 400, dynamic sense amplifier flop circuit 700 does not include a pulse generator 308 that may be triggered ON by a rising CK input and/or OFF by a falling of the signal at evaluation nodes m and/or m1.

With flop circuit 700, at the start of an evaluation process nodes m11 and m10 may be discharged through the transistor stack. For example, a first current may discharge node m11 through transistors N101, N102 and N113, while a second current may also discharge node m11 through transistors N101, N103, N104, and N113, and a third current may discharge node m10 through transistors N107, N108 and N113. Here, ideally the first and third currents will be approximately equal and the first and second currents combined will be greater than the third current such that node m11 is discharged faster than node m10. Unfortunately, certain process variations may, however, adversely affect this type of "fighting currents" design and/or operation which may, for example, lead to the wrong data being maintained by flop circuit 700 and/or the inability of flop circuit 700 to meet a desired operating frequency.

With flop circuit 700, ideally transistor N114 will be "stronger" than transistor P106 to allow latch node q10_n to be held to a logic "0" state. Unfortunately, certain process variations may, however, adversely affect this type of "transistor fight" design and/or operation which may, for example, lead to the wrong data being maintained by flop circuit 700 and/or the inability of flop circuit 700 to meet a desired operating frequency.

These potential concerns may not become an issue with a dynamic sense amplifier flop circuit 400, which may be more process variation tolerant in that there is no current fighting at the beginning of an evaluation and/or transistor fighting when updating the latch node q_n. Moreover, as previously mentioned, the pulsed logic signals sebck and seck may track process variations. For example, if a process variation leads to an NMOS transistor operating faster, then the logic signals (e.g., an edge) may become correspondingly faster. Conversely, for example, if a process variation leads to an NMOS transistor operating slower, then the logic signals (e.g., an edge) may become correspondingly slower.

Those skilled in the art may also recognize other potential benefits to the exemplary dynamic sense amplifier flop circuit 400, such as, for example, a potential reduction is setup time. Further, for example, a single transistor in the exemplary upper stack in dynamic sense amplifier flop circuit 400 may be adapted to essentially perform the isolation, selection and clock operations that in a circuit like flop circuit 700 may have required three stacked transistors.

While certain exemplary techniques have been described and shown herein using various methods and apparatuses, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof.

What is claimed is:

1. A circuit comprising:
   a pulse generating circuit to generate at least a first logic signal, said pulse generating circuit comprising a first logic gate circuit to generate a first logic gate output signal based, at least in part, on a first evaluation node signal, a second evaluation node signal and a scan enable signal, and a second logic gate circuit to generate said first logic signal based, at least in part, on said first evaluation node signal and a clock signal; and
   a discharge path circuit coupled to said pulse generating circuit, said discharge path circuit comprising at least a first transistor within a first stack of transistors, said first transistor being operatively responsive to said first logic signal, said discharge path circuit further comprising at least a second transistor within a second stack of transistors, said second transistor arranged in series with said first transistor, and wherein said first evaluation node signal is selectively discharged via a path through both said first and second transistors.

2. The circuit as recited in claim 1, wherein said pulse generating circuit to transition said first logic signal from a first logic state to a second logic state based, at least in part, on an edge of at least one of said first evaluation node signal and/or said second evaluation node signal.

3. The circuit as recited in claim 2, wherein said first logic gate circuit to perform a logical AND or NAND operation of said first evaluation node signal, said second evaluation node signal and said scan enable signal.

4. The circuit as recited in claim 1, wherein said pulse generating circuit to transition said first logic signal from a first logic state to a second logic state based, at least in part, on an edge of said clock signal.

5. The circuit as recited in claim 4, wherein said second logic gate circuit to perform a logical OR or NOR operation of said first logic signal and said clock signal.

6. The circuit as recited in claim 1, wherein said second transistor is operatively responsive to at least one a data signal and a scan in signal.

7. The circuit as recited in claim 1, wherein, when said first transistor and said second transistor selectively discharge said first evaluation node signal, substantially all electrical current associated with the discharge flows through said first and second transistors.

8. The circuit as recited in claim 1, wherein said discharge path circuit comprises only two transistor stacks.

9. The circuit as recited in claim 1 wherein said pulse generating circuit to output a second logic signal based, at least in part, on a second evaluation node signal, and said discharge path circuit comprises at least a one more transistor within said first stack of transistors, said at least one more transistor being operatively responsive to said second logic signal.

10. The circuit as recited in claim 1, further comprising at least one other circuit coupled to at least said discharge path circuit to provide at least said first evaluation node signal.

11. The circuit as recited in claim 10, wherein said at least one other circuit comprises at least one circuit selected from a group of circuits comprising a pre-charger circuit and a keeper circuit.

12. The circuit as recited in claim 1, further comprising at least one other circuit coupled to at least said discharge path circuit to provide an output signal based, at least in part, on said first evaluation node signal.

13. The circuit as recited in claim 12, wherein said at least one other circuit comprises an output latch circuit.

14. The circuit as recited in claim 1, wherein said circuit comprises a dynamic sense amplifier flop circuit.

15. The circuit as recited in claim 1, wherein said first evaluation node signal represents a logic state.

16. The circuit as recited in claim 1, wherein said pulse generating circuit is self-timed based, at least in part, on said first evaluation node signal.

17. The circuit as recited in claim 1, wherein said first transistor comprises an NMOS transistor.

18. A method for use in an integrated circuit, the method comprising:
   generating at least a first logic signal based, at least in part, on a clock signal and a first logic gate output signal, wherein said first logic gate output signaling is based, at least in part, on a first evaluation node signal and a second evaluation node signal which are associated with a keeper circuit, and a scan enable signal;
   providing said first logic signal to at least a first transistor within a first stack of transistors of a discharge path circuit, said first transistor being operatively responsive to said first logic signal; providing a data signal to at least a second transistor within a second stack of transistors of said discharge path circuit, said second transistor arranged in series with said first transistor and operatively responsive to said data signal; and selectively discharging said first evaluation node signal via a discharge path having only two transistors comprising said first transistor and said second transistor.

19. The method as recited in claim 18, wherein generating said first logic signal further comprises: performing a logical AND or NAND operation of said first evaluation node signal, said second evaluation node signal and said scan enable signal; and, performing a logical OR or NOR operation of said first logic signal and said clock signal.

* * * * *